(12) United States Patent
Califorrniaa

(10) Patent No.: US 6,959,314 B1
(45) Date of Patent: Oct. 25, 2005

(54) METHOD OF TRANSLATING BOOLEAN ALGEBRA INTO BASIC ALGEBRA

(76) Inventor: Eurica Califorrniaa, P.O. Box 2328, Malibu, CA (US) 90265-7328

( * ) Notice: Subject to any disclaimer, the term of this patent is extended or adjusted under 35 U.S.C. 154(b) by 631 days.

(21) Appl. No.: 10/145,189

(22) Filed: May 13, 2002

(51) Int. Cl.[7] ............................................. G06F 15/00
(52) U.S. Cl. ................................................ 708/200
(58) Field of Search ............................. 708/200, 204; 716/3

(56) References Cited

U.S. PATENT DOCUMENTS 3,654,610 A * 4/1972 Sander et al. ................. 365/49
4,417,305 A 11/1983 Berstis
5,513,122 A * 4/1996 Cheng et al. .................. 716/5
6,285,303 B1 9/2001 Califorrniaa

* cited by examiner

*Primary Examiner*—Chuong D Ngo

(57) ABSTRACT

Substituting words written in basic algebra for equivalent words written in Boolean algebra so as to translate Boolean algebra into basic algebra; more generally, summing combinational identity functions factored by their corresponding output values to convert a gate table into basic algebra. The resulting expressions of basic algebra can be simplified and evaluated in the usual straightforward manner.

3 Claims, 7 Drawing Sheets

Basic Lexicon of Translational Equivalents

| Gate | Boolean Word | Word in Basic Algebra (in selected calgebraic dialects) | | |
|---|---|---|---|---|
| | | $\{0,1\}$ | $\{-1,1\}$ | $\{s_0,s_1\}$ |
| $s_0$ | $A \times \bar{A}$ | 0 | $-1$ | $s_0$ |
| NOR | $\overline{A+B}$ | $1-a-b+ab$ | $\dfrac{ab-a-b-1}{2}$ | $s_0 + \dfrac{(a-s_1)(b-s_1)}{s_1-s_0}$ |
| $A > B$ | $A \times \bar{B}$ | $a-ab$ | $\dfrac{a-b-ab-1}{2}$ | $s_0 - \dfrac{(a-s_0)(b-s_1)}{s_1-s_0}$ |
| NOT(B) | $\bar{B}$ | $1-b$ | $-b$ | $s_0 + s_1 - b$ |
| $B > A$ | $\bar{A} \times B$ | $b-ab$ | $\dfrac{b-a-ab-1}{2}$ | $s_0 - \dfrac{(a-s_1)(b-s_0)}{(s_1-s_0)}$ |
| NOT | $\bar{A}$ | $1-a$ | $-a$ | $s_0 + s_1 - a$ |
| XOR | $(A \times \bar{B})+(\bar{A} \times B)$ | $a+b-2ab$ | $-ab$ | $s_1 - \dfrac{(a-s_0)(b-s_0)+(a-s_1)(b-s_1)}{s_1-s_0}$ |
| NAND | $\overline{A \times B}$ | $1-ab$ | $\dfrac{1-a-b-ab}{2}$ | $s_1 - \dfrac{(a-s_0)(b-s_0)}{s_1-s_0}$ |
| AND | $A \times B$ | $ab$ | $\dfrac{a+b+ab-1}{2}$ | $s_0 + \dfrac{(a-s_0)(b-s_0)}{s_1-s_0}$ |
| XNOR | $(\bar{A} \times \bar{B})+(A \times B)$ | $1-a-b+2ab$ | $ab$ | $s_0 + \dfrac{(a-s_0)(b-s_0)+(a-s_1)(b-s_1)}{s_1-s_0}$ |
| A | $\bar{\bar{A}}$ | $a$ | $a$ | $a$ |
| $B \leq A$ | $A + \bar{B}$ | $1-b+ab$ | $\dfrac{1+a-b+ab}{2}$ | $s_1 + \dfrac{(a-s_1)(b-s_0)}{(s_1-s_0)}$ |
| B | $\bar{\bar{B}}$ | $b$ | $b$ | $b$ |
| $A \leq B$ | $\bar{A}+B$ | $1-a+ab$ | $\dfrac{1-a+b+ab}{2}$ | $s_1 + \dfrac{(a-s_0)(b-s_1)}{s_1-s_0}$ |
| OR | $A+B$ | $a+b-ab$ | $\dfrac{1+a+b-ab}{2}$ | $s_1 - \dfrac{(a-s_1)(b-s_1)}{s_1-s_0}$ |
| $s_1$ | $A+\bar{A}$ | 1 | 1 | $s_1$ |

| Basic Lexicon of Translational Equivalents ||||||
|---|---|---|---|---|
| | | Word in Basic Algebra (in selected calgebraic dialects) |||
| Gate | Boolean Word | $\{0,1\}$ | $\{-1,1\}$ | $\{s_0, s_1\}$ |
| $s_0$ | $A \times \overline{A}$ | 0 | $-1$ | $s_0$ |
| NOR | $\overline{A+B}$ | $1-a-b+ab$ | $\dfrac{ab-a-b-1}{2}$ | $s_0 + \dfrac{(a-s_1)(b-s_1)}{s_1-s_0}$ |
| $A > B$ | $A \times \overline{B}$ | $a-ab$ | $\dfrac{a-b-ab-1}{2}$ | $s_0 - \dfrac{(a-s_0)(b-s_1)}{s_1-s_0}$ |
| NOT(B) | $\overline{B}$ | $1-b$ | $-b$ | $s_0 + s_1 - b$ |
| $B > A$ | $\overline{A} \times B$ | $b-ab$ | $\dfrac{b-a-ab-1}{2}$ | $s_0 - \dfrac{(a-s_1)(b-s_0)}{(s_1-s_0)}$ |
| NOT | $\overline{A}$ | $1-a$ | $-a$ | $s_0 + s_1 - a$ |
| XOR | $(A \times \overline{B}) + (\overline{A} \times B)$ | $a+b-2ab$ | $-ab$ | $s_1 - \dfrac{(a-s_0)(b-s_0)+(a-s_1)(b-s_1)}{s_1-s_0}$ |
| NAND | $\overline{A \times B}$ | $1-ab$ | $\dfrac{1-a-b-ab}{2}$ | $s_1 - \dfrac{(a-s_0)(b-s_0)}{s_1-s_0}$ |
| AND | $A \times B$ | $ab$ | $\dfrac{a+b+ab-1}{2}$ | $s_0 + \dfrac{(a-s_0)(b-s_0)}{s_1-s_0}$ |
| XNOR | $(\overline{A} \times \overline{B}) + (A \times B)$ | $1-a-b+2ab$ | $ab$ | $s_0 + \dfrac{(a-s_0)(b-s_0)+(a-s_1)(b-s_1)}{s_1-s_0}$ |
| A | $\overline{\overline{A}}$ | $a$ | $a$ | $a$ |
| $B \leq A$ | $A + \overline{B}$ | $1-b+ab$ | $\dfrac{1+a-b+ab}{2}$ | $s_1 + \dfrac{(a-s_1)(b-s_0)}{(s_1-s_0)}$ |
| B | $\overline{\overline{B}}$ | $b$ | $b$ | $b$ |
| $A \leq B$ | $\overline{A} + B$ | $1-a+ab$ | $\dfrac{1-a+b+ab}{2}$ | $s_1 + \dfrac{(a-s_0)(b-s_1)}{s_1-s_0}$ |
| OR | $A + B$ | $a+b-ab$ | $\dfrac{1+a+b-ab}{2}$ | $s_1 - \dfrac{(a-s_1)(b-s_1)}{s_1-s_0}$ |
| $s_1$ | $A + \overline{A}$ | 1 | 1 | $s_1$ |

FIG. 1

| Extended Lexicon of Translational Equivalents | | |
|---|---|---|
| Gate | Boolean Word | Word in Basic Algebra[1] |
| NOR | $\overline{A_1 + A_2 + \ldots A_n}$ | $s_0 - \dfrac{(a_1 - s_1)(a_2 - s_1)\ldots(a_n - s_1)}{(s_0 - s_1)^{n-1}}$ |
| XOR | $XOR[A_n,\ldots A_2, A_1]$[2] | $s_1 + \dfrac{(a_1 - s_1)(a_2 - s_1)\ldots(a_n - s_1)}{(s_0 - s_1)^{n-1}} - \dfrac{(a_1 - s_0)(a_2 - s_0)\ldots(a_n - s_0)}{(s_1 - s_0)^{n-1}}$ |
| NAND | $\overline{A_1 \times A_2 \times \ldots A_n}$ | $s_1 - \dfrac{(a_1 - s_0)(a_2 - s_0)\ldots(a_n - s_0)}{(s_1 - s_0)^{n-1}}$ |
| AND | $A_1 \times A_2 \times \ldots A_n$ | $s_0 + \dfrac{(a_1 - s_0)(a_2 - s_0)\ldots(a_n - s_0)}{(s_1 - s_0)^{n-1}}$ |
| XNOR | $XNOR[A_n,\ldots A_2, A_1]$[3] | $s_0 - \dfrac{(a_1 - s_1)(a_2 - s_1)\ldots(a_n - s_1)}{(s_0 - s_1)^{n-1}} + \dfrac{(a_1 - s_0)(a_2 - s_0)\ldots(a_n - s_0)}{(s_1 - s_0)^{n-1}}$ |
| OR | $A_1 + A_2 + \ldots A_n$ | $s_1 + \dfrac{(a_1 - s_1)(a_2 - s_1)\ldots(a_n - s_1)}{(s_0 - s_1)^{n-1}}$ |

Note 1: Written in the general dialect $\{s_0, s_1\}$, these calgebraic words (words in basic algebra according to the invention) apply in general only for $n \geq 2$ (gates with two or more inputs).

Note 2: $XOR[A_n,\ldots A_2, A_1] = \overline{(\overline{A_1} \times \overline{A_2} \times \ldots \overline{A_n})} + (A_1 \times A_2 \times \ldots A_n)$ Note 3: $XNOR[A_n,\ldots A_2, A_1] = (\overline{A_1} \times \overline{A_2} \times \ldots \overline{A_n}) + (A_1 \times A_2 \times \ldots A_n)$

FIG. 2

| Signal Assignment |
|---|
| $a_i : \{s_{0,i}, s_{1,i}, \ldots, s_{\alpha_i-1,i}\}$ |
| Description: This notation means the ith input variable $a_i$ observes the stated signal values (or states) $s_{p,i}$. |
| $a_i$: ith input variable<br>$\alpha_i$: base of the ith input variable; number of signal states observed<br>$s_{p,i}$: pth of $\alpha_i$ signal states assigned to the ith input variable |
| Note: p ranges from 0 to $\alpha_i$-1. |

FIG. 3

| Signal Identity Function (SIF) |
|---|
| $$SIF[s_{x,i}] = \prod_{\substack{p:0,\alpha_i-1}}^{s_{p,i} \neq s_{x,i}} \frac{(a_i - s_{p,i})}{(s_{x,i} - s_{p,i})}$$ |
| Operation: If $a_i = s_{x,i}$, then $SIF[s_{x,i}]=1$; else $SIF[s_{x,i}]=0$.<br>Description: Identifies when the ith input variable $a_i$ equals a designated xth one ($s_{x,i}$) of its $\alpha_i$ signal states $s_{p,i}$. (Identifies the xth signal state of the ith input variable.) |
| $s_{x,i}$: a designated xth one of $\alpha_i$ signal states $s_{p,i}$ |
| See also Fig. 3. |
| Note: Though p ranges from 0 to $\alpha_i$-1, the product $\prod$ iterates every instance of p except the one for which $s_{p,i}=s_{x,i}$; meaning, $\prod$ is taken over p except x. |

FIG. 4A

| Signal Identity Function (SIF) |
|---|
| $$\text{SIF}[a_{r,i}] = \prod_{p:0,\alpha_i-1}^{s_{p,i} \neq a_{r,i}} \frac{(a_i - s_{p,i})}{(a_{r,i} - s_{p,i})}$$ |
| Operation: If $a_i = a_{r,i}$, then $\text{SIF}[a_{r,i}]=1$; else $\text{SIF}[a_{r,i}]=0$.<br>Description: Identifies when the ith input variable $a_i$ equals the value $a_{r,i}$ stated for it in the rth row of a gate table. (Identifies the signal state given in the rth row of the ith input column.) |
| $a_{r,i}$: value of the ith input variable in the rth row of a gate table |
| See also Fig. 4A. |
| Note: Though p ranges from 0 to $\alpha_i-1$, the product $\Pi$ iterates every instance of p except the one for which $s_{p,i}=a_{r,i}$. |

FIG. 4B

| Combinational Identity Function (CIF) |
|---|
| $$\text{CIF}[r] = \prod_{i:1,n} \text{SIF}[a_{r,i}] = \prod_{i:1,n} \prod_{p:0,\alpha_i-1}^{s_{p,i} \neq a_{r,i}} \frac{(a_i - s_{p,i})}{(a_{r,i} - s_{p,i})}$$ |
| Operation: If $\{a_n,...a_2,a_1\}=\{a_{r,n},...a_{r,2},a_{r,1}\}$, then $\text{CIF}[r]=1$; else $\text{CIF}[r]=0$.<br>Description: Identifies when n input variables address an rth designated row of input data in a gate table. (Identifies the rth row of a gate table.) |
| See also Fig. 4B. |
| Note: i ranges from 1 to n as the number of inputs. |

FIG. 5

| Method of Converting a Gate Table into an Expression of Basic Algebra |
|---|
| $$y = \sum_r b_r CIF[r] = \sum_r b_r \prod_{i:1,n} \prod_{p:0,\alpha_i-1}^{s_{p,i} \neq a_{r,i}} \frac{(a_i - s_{p,i})}{(a_{r,i} - s_{p,i})}$$ |
| Operation: Sums combinational identity functions factored by their corresponding output values for each row in a gate table.<br>Description: Converts a gate table into basic algebra. |
| $b_r$: output data entry corresponding to the rth row of input data |
| See also Fig. 5. |
| Note: The sum $\Sigma$ iterates r for each row in a gate table. |

FIG. 6

| $a_n$ ... $a_2$ $a_1$ | y |
|---|---|
| 0 ... 0 0 | $b_0$ |
| 0 ... 0 1 | $b_1$ |
| 0 ... 1 0 | $b_2$ |
| 0 ... 1 1 | $b_3$ |
| ... ... ... ... | ... |
| 1 ... 1 1 | $b_{2^n-1}$ | convert ⇄ permute $y = (1-a_n) \ldots (1-a_2)(1-a_1) \; b_0$
$\; + (1-a_n) \ldots (1-a_2)(a_1) \; b_1$
$\; + (1-a_n) \ldots (a_2)(1-a_1) \; b_2$
$\; + (1-a_n) \ldots (a_2)(a_1) \; b_3$
$\ldots$
$\; + (a_n) \ldots (a_2)(a_1) \; b_{2^n-1}$ Gate Table             Basic Algebra

FIG. 7A

| $a_n$ ... $a_2$ $a_1$ | y |
|---|---|
| -1 ... -1 -1 | $b_0$ |
| -1 ... -1 1 | $b_1$ |
| -1 ... 1 -1 | $b_2$ |
| -1 ... 1 1 | $b_3$ |
| ... ... ... ... | ... |
| 1 ... 1 1 | $b_{2^n-1}$ |

$\xrightarrow{\text{convert}}$
$\xleftarrow{\text{permute}}$ $$y = \left(\frac{1-a_n}{2}\right) \ldots \left(\frac{1-a_2}{2}\right)\left(\frac{1-a_1}{2}\right) b_0$$
$$+ \left(\frac{1-a_n}{2}\right) \ldots \left(\frac{1-a_2}{2}\right)\left(\frac{a_1+1}{2}\right) b_1$$
$$+ \left(\frac{1-a_n}{2}\right) \ldots \left(\frac{a_2+1}{2}\right)\left(\frac{1-a_1}{2}\right) b_2$$
$$+ \left(\frac{1-a_n}{2}\right) \ldots \left(\frac{a_2+1}{2}\right)\left(\frac{a_1+1}{2}\right) b_3$$
$$\ldots$$
$$+ \left(\frac{a_n+1}{2}\right) \ldots \left(\frac{a_2+1}{2}\right)\left(\frac{a_1+1}{2}\right) b_{2^n-1}$$

FIG. 7B

| $a_n$ ... $a_2$ $a_1$ | y |
|---|---|
| $s_0$ ... $s_0$ $s_0$ | $b_0$ |
| $s_0$ ... $s_0$ $s_1$ | $b_1$ |
| $s_0$ ... $s_1$ $s_0$ | $b_2$ |
| $s_0$ ... $s_1$ $s_1$ | $b_3$ |
| ... ... ... ... | ... |
| $s_1$ ... $s_1$ $s_1$ | $b_{2^n-1}$ |

$\xrightarrow{\text{convert}}$
$\xleftarrow{\text{permute}}$ $$y = \left(\frac{s_1-a_n}{s_1-s_0}\right) \ldots \left(\frac{s_1-a_2}{s_1-s_0}\right)\left(\frac{s_1-a_1}{s_1-s_0}\right) b_0$$
$$+ \left(\frac{s_1-a_n}{s_1-s_0}\right) \ldots \left(\frac{s_1-a_2}{s_1-s_0}\right)\left(\frac{a_1-s_0}{s_1-s_0}\right) b_1$$
$$+ \left(\frac{s_1-a_n}{s_1-s_0}\right) \ldots \left(\frac{a_2-s_0}{s_1-s_0}\right)\left(\frac{s_1-a_1}{s_1-s_0}\right) b_2$$
$$+ \left(\frac{s_1-a_n}{s_1-s_0}\right) \ldots \left(\frac{a_2-s_0}{s_1-s_0}\right)\left(\frac{a_1-s_0}{s_1-s_0}\right) b_3$$
$$\ldots$$
$$+ \left(\frac{a_n-s_0}{s_1-s_0}\right) \ldots \left(\frac{a_2-s_0}{s_1-s_0}\right)\left(\frac{a_1-s_0}{s_1-s_0}\right) b_{2^n-1}$$

FIG. 7C

| Shortcut Method of Converting a Gate Table with Binary Output into an Expression of Basic Algebra ||
|---|---|
| $s_0$ route | $y = s_1 + (s_0 - s_1) \sum_{r}^{b_r = s_0} CIF[r]$ |
| $s_1$ route | $y = s_0 + (s_1 - s_0) \sum_{r}^{b_r = s_1} CIF[r]$ |
| Operation: Provides a shortcut method of converting a gate table with binary output into an expression of basic algebra.<br>Description: Converts a gate table with binary output into basic algebra. ||
| See also Fig. 6. ||
| Note: According to the $s_0$ route, the sum $\Sigma$ iterates r for each row with output $b_r = s_0$ in a gate table with binary output, but not for rows with $b_r = s_1$; similarly, according to the $s_1$ route, $\Sigma$ iterates r for each row with $b_r = s_1$, but not for rows with $b_r = s_0$. ||

FIG. 8

METHOD OF TRANSLATING BOOLEAN ALGEBRA INTO BASIC ALGEBRA

BACKGROUND OF THE INVENTION

1. Field of the Invention

The invention relates to the field of computing.

2. Prior Art

Boolean algebra is the binary language of computing. Expressions of Boolean algebra are traditionally worded according to intersection (AND), union (OR), and complement (NOT) operations. A problem arises because Boolean algebra cannot be simplified or evaluated in the straightforward manner of basic algebra.

What is needed is a method of translating Boolean algebra into basic algebra.

BRIEF SUMMARY OF THE INVENTION

A method of translating expressions of Boolean algebra into expressions of basic algebra comprises substituting words written in basic algebra for equivalent words written in Boolean algebra. Thus, every expression of Boolean algebra can be directly translated into an expression of basic algebra, which can then be simplified and evaluated in the usual straightforward manner.

A method of converting gate tables into expressions of basic algebra comprises summing combinational identity functions factored by their corresponding output values. Thus, as an alternate route to translation, every expression of Boolean algebra can be indirectly translated into an expression of basic algebra, by first permuting the expression of Boolean algebra to yield a binary gate table, and then converting the gate table into an expression of basic algebra.

BRIEF DESCRIPTION OF THE SEVERAL VIEWS OF THE DRAWING

FIG. 1 shows the basic lexicon of translational equivalents;

FIG. 2 shows the extended lexicon of translational equivalents;

FIG. 3 shows the notation for signal assignment;

FIGS. 4A&B show the signal identity function;

FIG. 5 shows the combinational identity function;

FIGS. 6 & 7A–C show the TACM; and,

FIG. 8 shows the sTACM.

DETAILED DESCRIPTION OF THE INVENTION

The invention teaches: according to a first claim, a direct translation method (BATM, "Boolean-to-Arithmetic Translation Method") for translating an expression of Boolean algebra into an expression of basic algebra; according to a second claim, a direct conversion method (TACM, "Table-to-Arithmetic Conversion Method") for converting a gate table into an expression of basic algebra; and, according to a third claim, a shortcut version of the TACM (sTACM, "shortcut Table-to-Arithmetic Conversion Method") for converting a gate table with binary output into an expression of basic algebra.

The invention also teaches an indirect translation method (iBATM, "indirect Boolean-to-Arithmetic Translation Method") for translating an expression of Boolean algebra into an expression of basic algebra, by first permuting the expression of Boolean algebra to yield a binary gate table, and then applying the sTACM. Of the steps in the iBATM, only the sTACM is mentioned in the claims.

Parts I–III of the detailed description relate to claims 1–3 respectively.

I.

The invention enables every expression of Boolean algebra to be translated into an expression of basic algebra.

Algebraic Words

An algebraic expression is called a "word" to signify that the expression evaluates with a meaning. For example, in Boolean algebra the expression "intersection of A and B" is a word to signify the meaning AND; similarly, the expressions "union of A and B" and "complement of A" are words in Boolean algebra to signify the meanings OR and NOT respectively. Algebraic words can be combined to formulate various expressions, which in turn are also called words.

Every expression of Boolean algebra can be formulated by combining words from a minimum vocabulary. The minimum vocabulary for a functionally complete set of Boolean operations includes the word NAND (alternatively the words AND and NOT) or the word NOR (alternatively the words OR and NOT). In satisfying the minimum vocabulary, the vocabulary of Boolean algebra begins traditionally with the words AND, OR, and NOT. As the BATM provides a translation for the minimum vocabulary, every expression of Boolean algebra can be translated accordingly.

Binary Signals

Binary data is based on two signals, $\{s_0,s_1\}$. Values for signals must be numerically assigned in order to evaluate an expression of basic algebra involving signals. Various signal assignments (called "dialects") may be used, and some offer mathematical advantages over others. In binary computing, $\{s_0,s_1\}=\{0,1\}$ is the most popular numeric assignment of signal values, and this assignment is preferred overall for use with the BATM. Another noteworthy assignment is $\{s_0, s_1\}=\{-1,1\}$.

A general embodiment of the BATM incorporates signal values $s_0$ and $s_1$ as variables. Specific embodiments are then derived by particularizing $s_0$ and $s_1$ in the general embodiment with a specific assignment of values. A specific embodiment of the BATM is valid as a whole only for a specific assignment of signal values.

Direct Translation Method (BATM)

In a general embodiment of the BATM, the words "$s_0+(a-s_0)(b-s_0)/(s_1-s_0)$", "$s_1-(a-s_1)(b-s_1)/(s_1-s_0)$", and "$s_0+s_1-a$" written in basic algebra are substituted respectively for the words "the intersection of A and B", "the union of A and B", and "the complement of A" written in Boolean algebra, so as to translate expressions of Boolean algebra into expressions of basic algebra, which can then be simplified and evaluated in the usual straightforward manner. Because a functionally complete set of Boolean operations is covered by this limited vocabulary of words, the BATM enables every expression of Boolean algebra to be translated into an expression of basic algebra.

A preferred specific embodiment of the BATM observes the preferred assignment of signal values $\{s_0,s_1\}=\{0,1\}$. In this embodiment, the words "ab", "a+b−ab", and "1−a" written in basic algebra are substituted respectively for the words "the intersection of A and B", "the union of A and B", and "the complement of A" written in Boolean algebra. Note that the $\{0,1\}$ assignment offers the mathematical advantage that $a^n=a$, thus making it easier to simplify many of the expressions of basic algebra that result from use of the invention according to this assignment.

A next-to-preferred specific embodiment of the BATM observes the assignment of signal values $\{s_0,s_1\}=\{-1,1\}$. In this embodiment, the words "(a+b+ab−1)/2", "(1+a+b−ab)/2", and "−a" written in basic algebra are substituted respectively for the words "the intersection of A and B", "the union of A and B", and "the complement of A" written in Boolean algebra. Note that the $\{-1,1\}$ assignment offers the mathematical advantage that $a^n=1$ (even n) or $a^n=a$ (odd n), thus making it easier to simplify many of the expressions of basic algebra that result from use of the invention according to this assignment.

Lexicon of Translational Equivalents

The language of basic algebra according to the invention is called calgebra ("Californiaan algebra"). A bilingual lexicon is compiled by storing words written in Boolean algebra paired with their translational equivalents written in calgebra. Words in the lexicon can then be looked up and used to substitute directly for their translational equivalents. To this end, FIG. 1 presents a basic lexicon of translational equivalents, covering the 16 binary gates of two inputs and one output. Similarly, FIG. 2 presents an extended lexicon of translational equivalents.

II.

The invention further enables every gate table to be converted into an expression of basic algebra.

Gate Tables

A gate table is also known as a truth table or logic table. A gate table comprises data concerning n independent variables or inputs and one dependent variable or output. The number of different signals (signal states) a variable of digital significance can assume is called the base of the variable. The terms gate table, gate function, and gate are used interchangeably. A gate table represents data on the function of a gate by listing pairings of input and output data (row by row) in a tabular format.

Signal Identity Function

For each input data entry in a gate table, the TACM assigns a signal identity function (SIF). The SIF has the following properties: if its variable equals a designated signal value, the SIF evaluates at unity; else the SIF evaluates at zero.

FIG. 3 shows a preferred notation for assigning signals to a variable. In the example shown in FIG. 3, an ith input variable $a_i$ is assigned $\alpha_i$ signal values $s_{p,i}$ with p ranging from 0 to $\alpha_i-1$; $\alpha_i$ is the base of the ith input variable.

Consider the quantity $(a_i-s_{p,i})$. If $a_i=s_{p,i}$, then $(a_i-s_{p,i})=0$. Next, consider the product of the quantity $(a_i-s_{p,i})$ taken over p except x (meaning, over all signal states $s_{p,i}$ except for an xth designated signal state $s_{x,i}$). The product equals zero unless $a_i=s_{x,i}$ (meaning, unless the input equals the xth signal state); this is in keeping with SIF properties. But when $a_i=s_{x,i}$ (meaning, when the input equals the xth signal state), the product equals the product of the quantity $(s_{x,i}-s_{p,i})$ taken over p except x; this is contrary to SIF properties, which require the SIF to equal unity in this case. To fix this, the original product is divided by the product of the quantity $(s_{x,i}-s_{p,i})$ over p except x. This results in the SIF as the product of the quantity $(a_i-s_{p,i})/(s_{x,i}-s_{p,i})$ over p except x.

In a preferred notation, FIGS. 4A & 4B sum up the SIF methodology. These SIF embodiments differ in that each passes a designated signal value to the SIF in respectively direct versus indirect ways. In the case of SIF[$s_{x,i}$] (FIG. 4A) a signal value $s_{x,i}$ is directly passed to the SIF. In the case of SIF[$a_{r,i}$] (FIG. 4B) a signal value is indirectly passed to the SIF, by designating an address $a_{r,i}$ in a gate table where the signal value is stored (in the rth row of the ith input column).

The TACM and sTACM employ the SIF in indirect form, namely, as the product of the quantity $(a_i-s_{p,i})/(a_{r,i}-s_{p,i})$ over p except the one p for which $s_{p,i}=a_{r,i}$.

Combinational Identity Function (CIF)

For each row of input data in a gate table, the TACM assigns a combinational identity function (CIF). The CIF has the following properties: if n input variables address an rth designated row, the CIF evaluates at unity; else the CIF evaluates at zero. Meaning, if $\{a_n, \ldots a_2,a_1\}=\{a_{r,n}, \ldots a_{r,2},a_{r,1}\}$, then CIF[r]=1; else CIF[r]=0.

CIF[r] is the product of SIF[$a_{r,i}$] over i; i ranges from 1 to n as the number of inputs. Meaning, the CIF is formed by multiplying SIFs together for the rth row of input data. Thus, a combination of inputs is identified as addressing a designated row of input data when all SIFs for the row (and, hence, the CIF) evaluate at unity.

In a preferred notation, FIG. 5 sums up the CIF methodology.

Direct Conversion Method (TACM)

The TACM converts a gate table into an expression of basic algebra by summing CIFs factored by their corresponding output values for each row in a gate table. Meaning, $b_r$CIF[r] is summed over r for all the rows in a gate table, where $b_r$ is the output data entry corresponding to the rth row of input data. Note that $b_r$CIF[r]=$b_r$ for the row addressed by the input variables, and $b_r$CIF[r]=0 for the rows not addressed; thus, the sum of $b_r$CIF[r] over r gives an expression for a gate table in basic algebra.

In a preferred notation, FIG. 6 sums up the TACM. FIGS. 7A–C show the TACM for gate tables with binary input; FIG. 7A assigns $\{0,1\}$ to the inputs and is most descriptive of the invention, FIG. 7B assigns $\{-1,1\}$, and FIG. 7C is left general. Note that a gate table is recovered by permutation.

III.

The invention further enables every gate table with binary output to be converted into an expression of basic algebra using a shortcut method.

Shortcut Conversion Method (sTACM)

To convert a gate table with binary output into an expression of basic algebra, it is not necessary to sum CIFs factored by their corresponding output values for each row in a gate table. Instead, it suffices to follow one of two shortcut routes.

According to the $s_0$ route, CIFs are summed only for rows with output value $s_0$; the CIFs are not factored by their corresponding output values; instead, the sum of the CIFs is factored by the quantity $(s_0-s_1)$ and the term $s_1$ is added to the result.

According to the $s_1$ route, CIFs are summed only for rows with output value $s_1$; the CIFs are not factored by their corresponding output values; instead, the sum of the CIFs is factored by the quantity $(s_1-s_0)$ and the term $s_0$ is added to the result.

In general, recourse to the $s_0$ route is preferred when a gate table has fewer rows with output $s_0$, whereas recourse to the $s_1$ route is preferred when a gate table has fewer rows with output $s_1$.

In a preferred notation, FIG. 8 sums up the sTACM.

The invention is best practiced as a software implementation.

No claim is made to the exclusive right to use an algebraic expression or formula apart from the invention as shown and described.

I claim:

1. A method implemented by a computer for translating Boolean algebra into basic algebra, comprising:
   (a) assigning signal values $s_0$ and $s_1$ to variables, preferably $\{s_0,s_1\}=\{0,1\}$; and
   (b) substituting respectively the words "$s_0+(a-s_0)(b-s_0)/(s_1-s_0)$", "$s_1-(a-s_1)(b-s_1)/(s_1-s_0)$", and "$s_0+s_1-a$" written in basic algebra for the words "intersection of A and B", "union of A and B", and "complement of A" written in Boolean algebra, so as to translate expressions of Boolean algebra into expressions of basic algebra, which can then be simplified and evaluated in the usual straightforward manner.

2. A method implemented by a computer for converting gate tables into basic algebra, comprising:
   (a) assigning a signal identity function for each input data entry in a given row of a gate table as required to assign a combinational identity function for the given row in step (b);
   (b) assigning a combinational identity function and factoring it by its corresponding output value for each row of input data in the gate table; and
   (c) summing combinational identity functions factored by their corresponding output values for each row in the gate table.

3. A shortcut method implemented by a computer for converting gate tables with binary output into basic algebra, comprising:
   (a) assigning a signal identity function for each input data entry in a given row of a gate table as required to assign a combinational identity function for the given row in step (b);
   (b) assigning a combinational identity function either for each row of input data in the gate table with output $s_0$ or for each row with output $s_1$; and
   (c) summing combinational identity functions either for rows in the gate table with output $s_0$ or for rows with output $s_1$, such that if rows with output $s_0$ are selected, the sum is factored by the quantity $(s_0-s_1)$ and $s_1$ is added to the result, or if rows with output $s_1$ are selected, the sum is factored by the quantity $(s_1-s_0)$ and $s_0$ is added to the result.

* * * * *